US007782681B2

(12) United States Patent  (10) Patent No.: US 7,782,681 B2
Kim et al.  (45) Date of Patent: Aug. 24, 2010

(54) OPERATION METHOD OF FLASH MEMORY DEVICE CAPABLE OF DOWN-SHIFTING A THRESHOLD VOLTAGE DISTRIBUTION OF MEMORY CELLS IN A POST-PROGRAM VERIFY OPERATION

(75) Inventors: Jun In Kim, Incheon-si (KR); Ju Yeab Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 307 days.

(21) Appl. No.: 11/965,193

(22) Filed: Dec. 27, 2007

(65) Prior Publication Data

US 2009/0003084 A1  Jan. 1, 2009

(30) Foreign Application Priority Data

Jun. 29, 2007  (KR) .................... 10-2007-0065838

(51) Int. Cl.
*G11C 11/34* (2006.01)
*G11C 16/04* (2006.01)

(52) U.S. Cl. .................... 365/185.29; 365/185.22; 365/185.3; 365/185.33

(58) Field of Classification Search ............ 365/185.02, 365/185.22, 185.25, 185.29, 185.3, 185.33, 365/182.02 X, 185.22 X, 185.25 X, 185.3 X
See application file for complete search history.

(56) References Cited

U.S. PATENT DOCUMENTS

| 5,986,933 | A | * | 11/1999 | Takeuchi et al. | ........ 365/185.12 |
| 6,999,345 | B1 | | 2/2006 | Park et al. | |
| 7,020,017 | B2 | | 3/2006 | Chen et al. | |
| 7,200,049 | B2 | * | 4/2007 | Park et al. | .............. 365/185.29 |
| 7,349,263 | B2 | * | 3/2008 | Kim et al. | .............. 365/185.19 |
| 7,433,244 | B2 | * | 10/2008 | Yoon et al. | ............. 365/185.29 |
| 7,633,813 | B2 | * | 12/2009 | Wang et al. | ............ 365/185.29 |

FOREIGN PATENT DOCUMENTS

KR  10-2006-0044239  5/2006

* cited by examiner

*Primary Examiner*—VanThu Nguyen
(74) *Attorney, Agent, or Firm*—Marshall, Gerstein & Borun LLP

(57) ABSTRACT

In a driving method of a flash memory device including a selected first bit line and an unselected second bit line, a program voltage of a pulse is applied to word lines of all memory cells in a block passing an erase verify operation. After the first and second bit lines are precharged to a predetermined level, a ground voltage is applied to the word lines of all the memory cells in the block. The memory cells are evaluated for a predetermined time shorter than an evaluation time of a read operation. Whether or not a memory cell passing a verify operation exists among the memory cells is sensed. Resultantly, when the memory cell passing the verify operation exists, the memory cells in the block are programmed to a desired level using a predetermined program voltage and a step voltage.

16 Claims, 5 Drawing Sheets

OPERATION METHOD OF FLASH MEMORY DEVICE CAPABLE OF DOWN-SHIFTING A THRESHOLD VOLTAGE DISTRIBUTION OF MEMORY CELLS IN A POST-PROGRAM VERIFY OPERATION

CROSS-REFERENCE TO RELATED APPLICATIONS

This patent claims priority to Korean application number 10-2007-0065838, filed on Jun. 29, 2007, the disclosure of which is incorporated by reference in its entirety.

TECHNICAL FIELD

This patent relates to flash memory devices, and more particularly, to a driving method of a flash memory device, which is capable of preventing program failure by down-shifting a threshold voltage distribution of a memory cell in a post-program verify operation.

BACKGROUND OF THE INVENTION

Among various types of flash memory device, NAND-type flash memory devices are increasingly used as a high-capacity data storage media. To meet the demand for the high-capacity memory devices with high-integration, a multi-level cell (MLC) structure for the flash memory devices has recently been proposed, which is capable for increasing the data storage capacity in a smaller chip size. Generally, a single level cell (SLC) includes two states, i.e., a programmed state and an erased state, in one memory cell. Compared to a MLC flash memory device, the MLC flash memory device may store two bits or more in one memory cell. Therefore, the storage capacity of the MLC flash memory device is twice or more than a SLC flash memory device.

FIG. 1 illustrates threshold voltage distributions of programmed and erased states of a 2-bit MLC NAND-type flash memory device. Memory cells of the flash memory device may include erased or programmed states. In a SLC flash memory device, erased memory cells may have at least one relatively low threshold voltage distribution, for example, lower than 0 V. On the contrary, programmed memory cells may have at least one relatively high threshold voltage distribution, for example, higher than 0 V.

In the MLC NAND-type flash memory device where 2-bit data may be programmed in one memory cell, each memory cell may include a threshold voltage distribution 110 corresponding to an erased state (erased threshold voltage distribution) and a plurality of threshold voltage distributions 120, 130 and 140 corresponding to a plurality of programmed states (programmed threshold voltage distribution). The programmed threshold voltage distributions 120, 130 and 140 are distinguished from the erased threshold voltage distribution 110 by a first read voltage Vread0, for example, 0 V. The programmed threshold voltage distributions 120, 130 and 140 are distinguished from each other by a second read voltage Vread1 and a third read voltage Vread2, respectively. As shown in FIG. 1, the programmed threshold voltage distributions 120, 130 and 140 may be separated from each other between the first read voltage Vread0 and a pass voltage Vpass in the MLC NAND flash memory device and each of the threshold voltage distribution 110, 120, 130, 140 may a width as narrow as possible. Further, the threshold voltage distributions must be appropriately controlled such that the erased threshold voltage distribution as well as the programmed threshold voltage distribution has a width as narrow as possible in the case where the flash memory device employs an MLC structure.

A method of erasing data of the MLC flash memory device may include a pre-program operation, a normal erase operation, and a post-program operation. These operations may be performed in sequence. The post-program operation corresponds to a soft program, may be performed after a memory cell is erased and before the memory cell is programmed to various levels. Particularly, the post-program operation may be performed to narrow the width of a threshold voltage distribution that may be broadened after an erase operation. Further, the post-program operation may be performed in an incremental step pulse program (ISPP) method. However, a page by page program operation and a bit by bit verify operation, which are typically used in the ISSP method, are not used, instead a program operation is performed in units of a block. In other words, the post-program operation is performed using a method of programming the memory cell to a desired level by equally applying a program bias lower than a bias used in the program operation to all the word lines of one block at the same time.

During the post-program operation, a program verify operation is also performed after a program pulse is applied. The program operation is terminated only if all the memory cells exceed a verify level. Unlike the program operation, the post-program operation is terminated even if only one cell exceeds the verify level. The program verify operation may be performed by applying 0 V to all the word lines of a corresponding block so that a right tail of the threshold voltage is positioned to −1 V, as illustrated in FIG. 2, to prevent an increase in the width of the threshold voltage distribution due to an interference during the program operations.

FIG. 2 illustrates a shift of a threshold voltage distribution after performing a post-program operation of a NAND-type flash memory device. Reference numeral 210 denotes a threshold voltage distribution of a memory cell after a normal erase operation and reference numeral 212 denotes a threshold voltage distribution of a memory cell after the post-program operation. As the MLC NAND flash memory device requires a higher program voltage than a SLC flash memory device in order to exist a plurality of programmed states. The threshold voltage distribution of the memory cell may be shifted, thereby cause failure due to a program disturb or a program stress.

FIG. 3 illustrates variations of a threshold voltage distribution of a memory cell due to a program disturb or a program stress. Reference numeral 310 denotes a threshold voltage distribution of a memory cell after a post-program operation. As shown, a right tail of the threshold voltage distribution 310 is positioned at −1 V. Reference numerals 312 and 314 denote threshold voltage distributions of the memory cell undergoing a test program operation, e.g., number of partial program (NOP), once and twice, respectively, for confirming how the threshold voltage may be shifted due to the program disturb or the program stress after the post-program operation. As illustrated in FIG. 3, the threshold voltage distribution of the memory cell is shifted to the right when the program disturb or the program stress occurs after the post-program is performed. In particular, when performing the NOP twice, a right tail of the threshold voltage distribution 314 exceeds 0 V, that is, threshold voltages of some memory cells exceed 0 V (see dotted circle of FIG. 3), thus leading to a program fail as if these memory cells are determined as programmed cells in spite of erased cells.

The threshold voltage distribution may be down-shifted to prevent the program fail. The threshold voltage distribution may be shifted toward the left side thereof so that the right tail of the threshold voltage distribution is positioned at a voltage lower than −1 V when the erase operation including the post-program operation is completed in order to prevent the program fail, NOP fail, caused by the shift of the threshold voltage distribution due to the program disturb or the like in some degree. However, a verify level obtainable by applying 0 V to all the word lines during the post-program operation is about −1 V, as illustrated in FIG. 2, a negative bias may not be applied to the word lines. Accordingly, it is difficult to down-shift the threshold voltage distribution obtainable by a typical post-program operation to a level less than about −1 V.

SUMMARY OF THE INVENTION

Embodiments of the invention are directed to a driving method of a flash memory device, which is capable of preventing program failure such as those caused by a shift of a threshold voltage distribution due to a program disturb or a program stress after an erase operation by achieving the effect that a verify level is down-shifted through an increase in a sensing current during a post-program verify operation.

In an embodiment of the invention, a driving method of a flash memory device having a selected first bit line and an unselected second bit line, may include: applying a post program voltage to word lines of all memory cells in a block passing an erase verify operation; precharging the first and second bit lines to a predetermined level; applying a ground voltage to the word lines of all the memory cells in the block; evaluating the memory cells for a predetermined time shorter than an evaluation time of a read operation; sensing whether a memory cell passing a post program verify operation exists among the memory cells, according to whether charges accumulated in the first bit line are discharged; and programming the memory cells in the block to a desired level using a predetermined program voltage and a step voltage when the memory cell passing the post program verify operation exists.

Before the precharging of the first and second bit lines, the driving method may further include: discharging the first and second bit lines; and setting a page buffer connected to the first and second bit lines. The ground voltage applied to the word lines of all the memory cells in the block may be approximately 0 V.

In an embodiment of the invention, a driving method of a flash memory device having a selected first bit line and an unselected second bit line, may include: applying a post program voltage to word lines of all memory cells in a block passing an erase verify operation; precharging the first and second bit lines to a predetermined level; applying a ground voltage to the word lines of all the memory cells in the block; evaluating the memory cells; sensing whether a memory cell passing a verify post program operation exists among the memory cells for a predetermined time shorter than an evaluation time of a read operation; and programming the memory cells in the block to a desired level using a predetermined program voltage and a step voltage when a memory cell passing the post program verify operation exists.

Before the precharging of the first and second bit lines, the driving method may further include: discharging the first and second bit lines; and setting a page buffer connected to the first and second bit lines. The ground voltage applied to the word lines of all the memory cells in the block may be approximately 0 V.

BRIEF DESCRIPTION OF THE DRAWINGS

Hereinafter, a more complete understanding of the disclosure, reference should be made to the following detailed description and accompanying drawings wherein.

DETAILED DESCRIPTION

In an embodiment of the invention, during a post-program operation for reducing a threshold voltage of an erased cell, a threshold voltage of a memory cell is higher than its actual value if a sensing current $I_{trip}$ increases in a program verify operation. This enables a verify level to be relatively lowered, which provides the effect that the threshold voltage distribution of the memory cell is down-shifted after the post-program is completed.

Figure 1:
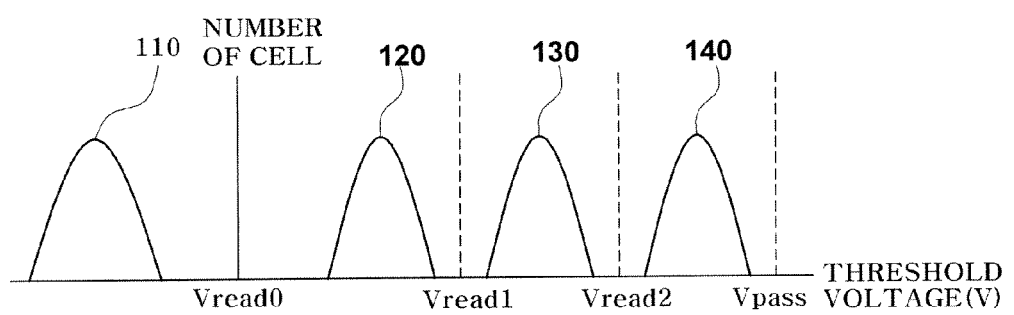
FIG. 1 illustrates threshold voltage distributions of programmed and erased states of a conventional 2-bit MLC NAND-type flash memory device.
Figure 2:
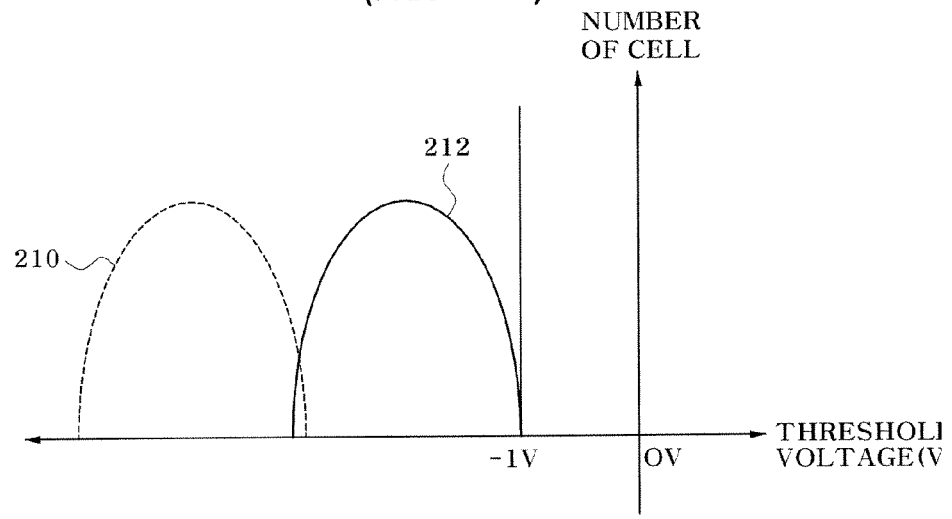
FIG. 2 illustrates a shift of a threshold voltage distribution after performing a post-program operation during an erase operation of a conventional NAND flash memory device of FIG. 1.
Figure 3:
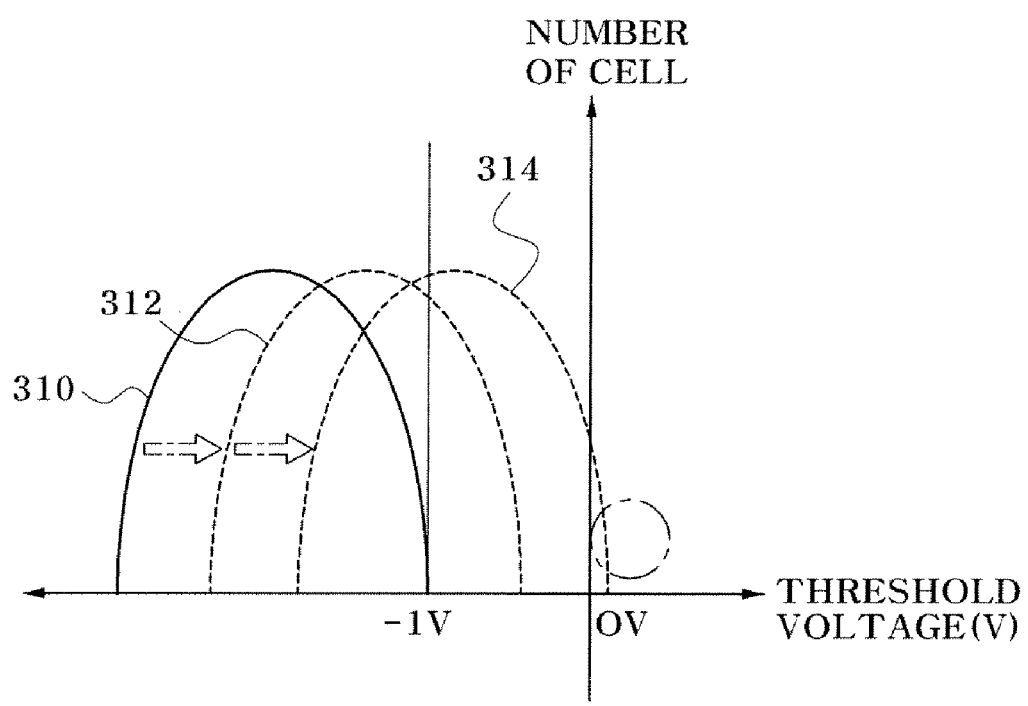
FIG. 3 illustrates variations of the threshold voltage distribution of a memory cell due to a program disturb or a program stress of FIG. 2.
Figure 4:
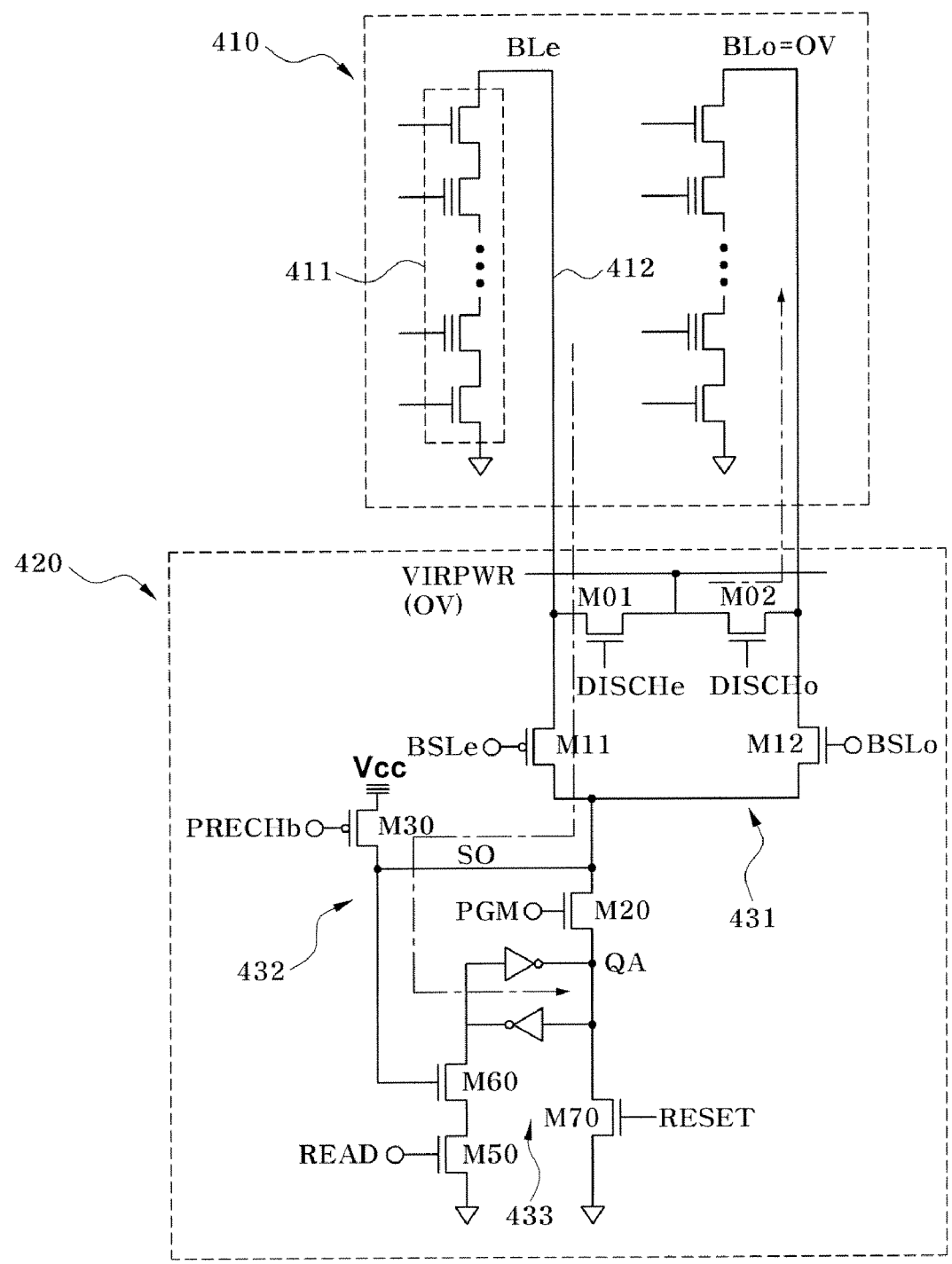
FIG. 4 illustrates a circuit diagram of a cell array and a page buffer in a NAND-type flash memory device according to an embodiment of the invention.

The magnitude of the sensing current Itrip flowing from a NAND string 411 of a cell array 410 (as shown in FIG. 4) to a sensing node SO of a page buffer 420 through a bit line 412 may be calculated from Eq. 1 below.

$$I_{trip} = (C_{BL} \times (V1-V2))/t_{EVAL} \quad \text{(Eq. 1)}$$

where $I_{trip}$ is the sensing current, $C_{BL}$ is a bit line capacitance, V1 and V2 are voltages applied to bit line select or unselect signals BSLe and BSLo (as shown in FIG. 4), and $t_{EVAL}$ is an evaluation time. As shown in Eq. 1, the sensing current Itrip may be increased if V1 increases, V2 decreases or the evaluation time $t_{EVAL}$ is shortened. Due to an increase in the sensing current $I_{trip}$, the threshold voltage of the memory cell in the page buffer 420 is read as a higher value than its actual value.

FIG. 4 illustrates a circuit diagram of a cell array 410 and a page buffer 420 in a non-volatile memory device, such as, a NAND-type flash memory device. The cell array 410 may include a plurality of NAND strings 411 arranged in a word line direction. Each of the NAND string 411 may include a plurality of select transistors and a plurality of memory cells, which are connected in series. Each of the NAND string 411 may be coupled to the page buffer 420 through a corresponding bit line 412. An even bit line BLe and an odd bit line BLo may form a bit line pair, which are coupled to the page buffer 420.

The page buffer 420 may include a bit line select/bias supply circuit 431, a precharge circuit 432 configured to precharge the bit line 412, and a latch 433 configured to store data. The bit line select/bias supply circuit 431 may be configured to select one of the bit lines BLe, BLo and then applies a bias to the selected bit line BLe or BLo. The bit line select/ bias supply circuit 431, the precharge circuit 432 and the latch 433 may be coupled to each other through a sensing node SO. The latch 433 may be coupled to an output node QA.

Figure 5:
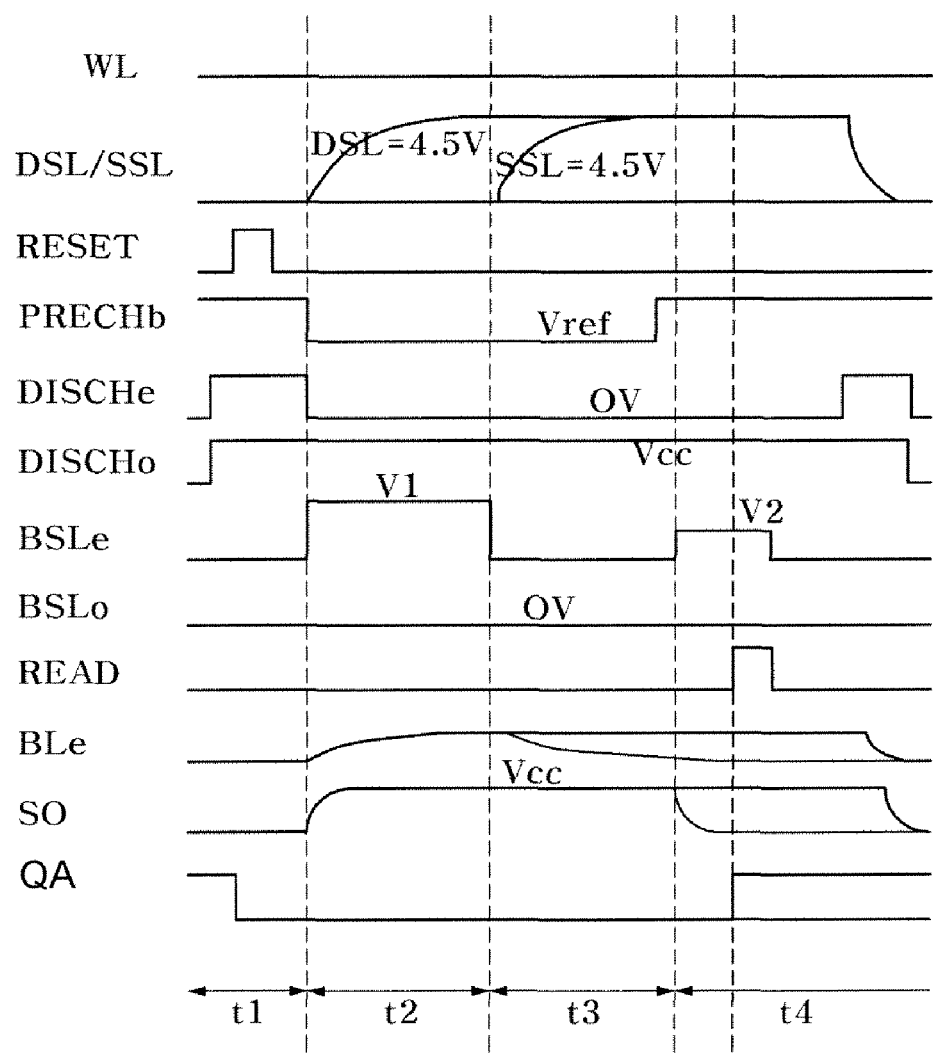
FIG. 5 illustrates a timing diagram of signals during a post-program operation of a flash memory device of FIG. 4.

FIG. 5 illustrates a timing diagram of signals during a post-program operation of a flash memory device of FIG. 4. Referring to FIGS. 4 and 5, before a data of a memory cell is read in a read operation so as to verify a programmed state of the memory cell, charges accumulated in the bit line 412 are discharged, and the page buffer 420 is then set to an initial state at t1. When discharge signals DISCHe and DISCHo of the bit line select/bias circuit 431 and a precharged signal PRECHb of the precharge circuit 432 of logic high levels are inputted, NMOS transistors M01 and M02 of the bit line select/bias circuit 431 are turned on but a PMOS transistor M30 of the precharge circuit 432 is turned off. A power line VIRPWR of the bit line select/bias circuit 431 is grounded to 0 V. Since the transistors M01 and M02 of the bit line select/bias circuit 431 are turned on, all the charges accumulated in the even bit line BLe and the odd bit line BLo of the cell array 410 exit to VIRPWR through the transistors M01 and M02 of the bit line select/bias circuit 431. Accordingly, both the bit lines BLe and BLo are discharged. When a reset signal RESET of logic high level of the latch 433 is applied, a reset transistor M70 of the latch 433 is turned on to set the output node QA to a low state. A low level signal is applied to gates of a drain select transistor, a source select transistor and a memory cell transistor in the NAND cell string 411.

The selected bit line BLe is precharged for sensing data at t2. From a start point of t2, a pass voltage Vpass of approximately 4.5 V is applied to a drain select line DSL, thus turning on a drain select transistor. A read voltage Vread, e.g., 0 V, starts to be applied to word lines WL of all the memory cell transistors in the cell array 410.

In the page buffer 420, the discharge signal DISCHe of the bit line select/bias circuit 431 and the precharge signal PRECHb of the precharge circuit 432 enter a logic low level in a state where the power line VIRPWR of the page buffer 420 is grounded to 0V. The bit line select signal BSLe of logic high level is applied while the bit line select signal BSLo is maintained at logic low level. As a result, the NMOS transistors M01 and M02 of the bit line select/bias circuit 431 are turned off, and the PMOS transistor M30 of the precharge circuit 432 is turned on. As the PMOS transistor M30 of the precharge circuit 432 is turned on, a power supply voltage Vcc is applied to the sensing node SO. When a signal corresponding to the voltage V1, e.g., approximately 2 V, is applied to the bit line select signal BSLe, the voltage of the even bit line BLe gradually rises up and the even bit line BLe is precharged to a predetermined level by a voltage difference of $V1-V^{th}$. Because the NMOS transistor M12 of the bit line select/bias circuit 431 is turned off and the NMOS transistor M02 of the bit line select/bias 431 is turned on, 0V continues to be applied to an unselected odd bit line BLo.

The pass voltage Vpass of approximately 4.5 V is applied to the source select line SSL of the NAND string 411 during a third section at t3, thus turning on a source select transistor. Consequently, current may or may not flow through the NAND string 411 depending on a state of the selected memory cell. The bit line select signal BSLe of logic low level is applied to evaluate the memory cell. Charges accumulated in the precharged bit line PRECHb of the precharge circuit 432 may be discharged or may remain in entirety depending on a programmed state of the selected memory cell.

According to a conventional verify method, the evaluation time is set to such a condition that charges accumulated in the selected even bit line BLe are sufficiently discharged. In the present invention, however, the evaluation time advantageously may be set to be shorter than a time for a typical read operation or program verify operation. Since data sensing is achieved in such a state that charges accumulated in the precharged bit line PRECHb of the precharge circuit 432 are not sufficiently discharged, the threshold voltage of the memory cell may be sensed higher than its actual value. In other words, it is possible to achieve the effect that the verify voltage is lowered.

After the lapse of a predetermined evaluation time, the transistors M01, M02, M11, M12, M30 and the latch 433 of the page buffer 420 are appropriately controlled to sense the state of a memory cell, i.e., whether or not the memory cell is programmed to a target level, and then to latch the sensed data at t4 as shown in FIG. 5. The precharge signal PRECHb enters the logic high level to turn off the PMOS transistor M30 of the precharge circuit 432. The voltage V2 of which a voltage level is lower than the voltage V1 is applied as the bit line select signal BSLe. Likewise, if setting a supply duration of the voltage V2 is shorter than the time for the typical read operation or program operation, it is possible to achieve the effect that the magnitude of the voltage V2 is lowered, which reduces a sensing time resultantly. The supply duration of the voltage V2 may be set appropriately depending on the desired applications.

In the case where the selected memory cell does not exceed a verify level PV, the selected memory cell transistor is turned on. Therefore, charges accumulated in the even bit line BLe are discharged to a memory cell, thus reducing a voltage of the even bit line BLe. Resultantly, a gate-source voltage $V_{gs}$ of the NMOS transistor M11 of the bit line select/bias circuit 431 becomes higher than the threshold voltage of the NMOS transistor M11, thereby turning on the NMOS transistor M11. As the NMOS transistor M11 is turned on, the charges accumulated in the sensing node SO are rapidly discharged to the even bit line BLe due to charge distribution between the even bit line BLe and the sensing node SO. Consequently, the voltage of the sensing node SO decreases to 0 V from the power supply voltage $V_{cc}$ of the precharge circuit 432.

In the case where the threshold voltage of the selected memory cell exceeds the verify level PV, the selected memory cell transistor is turned off. Therefore, charges accumulated in the even bit line BLe cannot be discharged to a memory cell, and thus the even bit line BLe is maintained at $(V1-V^{th})$ level. Accordingly, though the voltage V2 is applied as the bit line select signal BSLe, the gate-source voltage $V_{gs}$ of the NMOS transistor M11 is maintained at a level equal to the threshold voltage, and hence the NMOS transistor M11 is not turned on. Resultantly, a voltage of the sensing node SO maintains the power supply voltage $V_{cc}$.

After sensing the data, the sensed data are latched. When the selected memory cell transistor is turned on, that is, when the threshold voltage of the memory cell transistor does not exceed the verify level PV, the NMOS transistor M60 of the latch 433 maintains at turn-off state as the voltage of the sensing node SO drops to 0 V. Therefore, the output node QA maintains at logic low level. When the selected memory cell transistor is turned off, that is, when the threshold voltage of the selected memory cell transistor exceeds the verify level PV, the voltage of the sensing node SO maintains the power supply voltage $V_{cc}$ to turn on the NMOS transistor M60 of the latch 433, whereby the output node QA goes to the logic high level from the logic low level.

Resulting from the post-program verify operation, the post-program stops if there exists one memory cell passing the verify level, and the memory cell is then programmed to a desired level according to a typical ISPP method. When a verify operation or a read operation is performed according to the ISPP method, an evaluation time and supply durations of the voltages V1 and V2 may be used.

Figure 6:
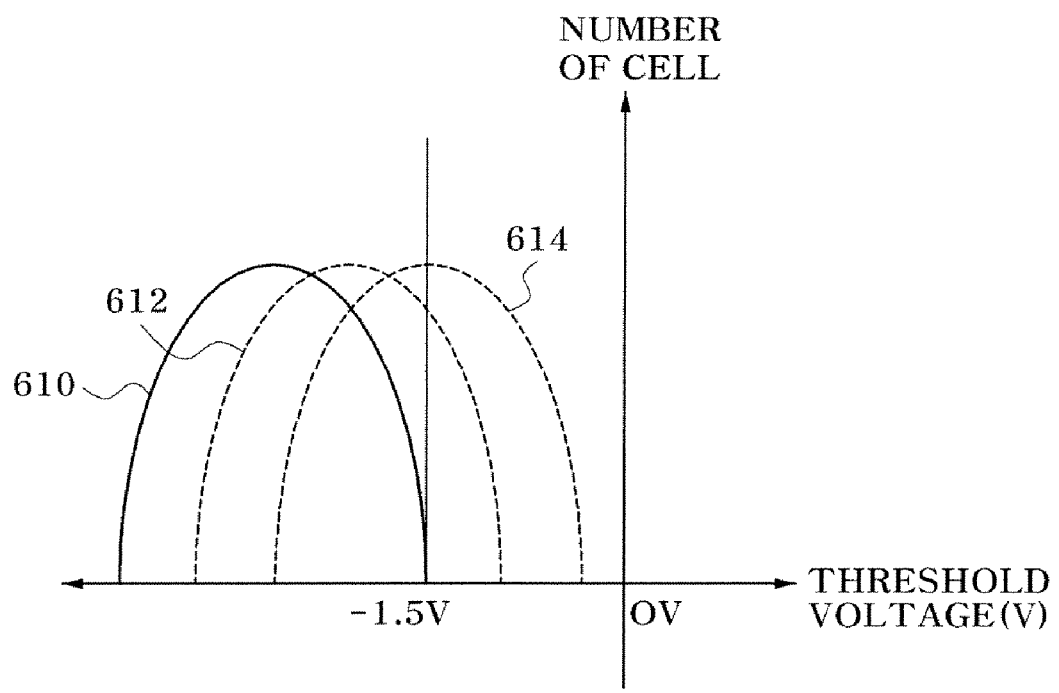
FIG. 6 illustrates variations of a threshold voltage distribution of a memory cell affected by a program disturb or stress, after performing a post-program operation of FIG. 4.

FIG. 6 illustrates variations of a threshold voltage distribution of a memory cell affected by a program disturb or stress, after performing a post-program operation.

Reference numeral 610 denotes a threshold voltage distribution of a memory cell after performing a post-program according to the present invention. A right tail of the threshold voltage distribution 610 is positioned at approximately −1.5 V. Reference numerals 612 and 614 denote threshold voltage distributions of the memory cell undergoing a test program, number of partial program (NOP), once and twice, respectively, for confirming how the threshold voltage is shifted due to the program disturb or the program stress after the post-program. As illustrated in FIG. 6, the threshold voltage distribution of the memory cell is shifted to the right when the program disturb or the program stress occurs after the post-program is completed. In an embodiment, the threshold voltage does not exceed 0V even though the NOP is performed, once or twice, because the threshold voltage distribution of the memory cell has been down-shifted to −1.5 V, which prevent program fails.

According to an embodiment of the invention, a sensing current $I_{trip}$ may be reduced by controlling an evaluation time or supply durations of voltages V1, V2 applied as bit lines select signals BSL during a post-program verify operation. Therefore, a threshold voltage V is measured higher than its actual value so that it is possible to down-shift the threshold voltage distribution of the memory cell. Accordingly, program fails do not occur even if the threshold voltage distribution of the memory cell is up-shifted due to a disturbance or stress of a program operation performed after the post-program operation.

Embodiments of the invention have been disclosed above for illustrative purposes. Those skilled in the art will appreciate that various modifications, additions and substitutions are possible, without departing from the scope and spirit of the invention as disclosed in the accompanying claims.

What is claimed is:

1. An erase method of a flash memory device comprising:
    applying a post program voltage to word lines of all memory cells in a block passing an erase verify operation;
    precharging a first and second bit lines to a predetermined level;
    applying a ground voltage to the word lines of all the memory cells in the block;
    evaluating the memory cells for a predetermined time shorter than an evaluation time of a read operation;
    sensing whether a memory cell passing a post program verify operation exists among the memory cells, according to whether charges accumulated in the first bit line are discharged; and
    programming the memory cells in the block to a desired level using a predetermined program voltage and a step voltage when the memory cell passing the post program verify operation exists.

2. The method of claim 1, further comprising, before the precharging of the first and second bit lines:
    discharging the first and second bit lines; and
    setting a page buffer connected to the first and second bit lines.

3. The method of claim 1, wherein the ground voltage applied to the word lines of all the memory cells in the block is approximately 0 V.

4. The method of claim 2, wherein the page buffer comprises a bit line select and bias supply circuit, a precharge circuit, a latch.

5. The method of claim 4, wherein a sensing node make the bit line select and bias supply circuit and the precharge circuit be coupled to the latch.

6. An erase method of a flash memory device comprising:
    applying a post program voltage to word lines of all memory cells in a block passing an erase verify operation;
    precharging a first and second bit lines to a predetermined level;
    applying a ground voltage to the word lines of all the memory cells in the block;
    evaluating the memory cells;
    sensing whether a memory cell passing a post program verify operation exists among the memory cells for a predetermined time shorter than an evaluation time of a read operation;
    programming the memory cells in the block to a desired level using a predetermined program voltage and a step voltage when the memory cell passing the post program verify operation exists.

7. The method of claim 6, further comprising, before the precharging of the first and second bit lines:
    discharging the first and second bit lines; and
    setting a page buffer connected to the first and second bit lines.

8. The method of claim 6, wherein the ground voltage applied to the word lines of all the memory cells in the block is approximately 0 V.

9. The method of claim 7, wherein the page buffer comprises a bit line select and bias supply circuit, a precharge circuit, a latch.

10. The method of claim 9, wherein a sensing node make the bit line select and bias supply circuit and the precharge circuit be coupled to the latch.

11. An erase method of a non-volatile memory device comprising:
    applying a post program voltage to memory cells passing an erase verify operation;
    precharging a first bit line and a second bit line to a predetermined level;
    applying a ground voltage to the memory cells;
    evaluating the memory cells;
    sensing whether a selected memory cell passing a post program verify operation exists among the memory cells;
    programming the array of memory cells to a desired level using a predetermined program voltage and a step voltage when the selected memory cell passing the post program verify operation exists.

12. The method of claim 11, further comprising setting a predetermined time shorter than an evaluation time of the selected memory cell during a read operation and discharging charges accumulated in the first bit line.

13. The method of claim 11, further comprising, before precharging of the first and second bit lines:
    discharging the first and second bit lines;
    setting a page buffer connected to the first and second bit lines.

14. The method of claim 11, wherein the ground voltage applied to the memory cells is approximately 0V.

15. The method of claim 13, wherein the page buffer comprises a bit line select and bias supply circuit, a precharge circuit, a latch.

16. The method of claim 15, wherein a sensing node make the bit line select and bias supply circuit and the precharge circuit be coupled to the latch.

* * * * *